(12) United States Patent
Furuya et al.

(10) Patent No.: US 7,813,905 B2
(45) Date of Patent: Oct. 12, 2010

(54) SIMULATION APPARATUS, SIMULATION METHOD, AND COMPUTER-READABLE RECORDING MEDIUM IN WHICH SIMULATION PROGRAM IS STORED

(75) Inventors: Atsushi Furuya, Kawasaki (JP); Koichi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/856,206

(22) Filed: Sep. 17, 2007

(65) Prior Publication Data

US 2008/0010046 A1 Jan. 10, 2008

Related U.S. Application Data

(63) Continuation of application No. PCT/JP2005/004809, filed on Mar. 17, 2005.

(51) Int. Cl.
G06G 7/48 (2006.01)
G06F 17/50 (2006.01)
(52) U.S. Cl. .............................. 703/6; 716/20
(58) Field of Classification Search .................... 703/6, 703/13, 14; 716/20
See application file for complete search history.

(56) References Cited

U.S. PATENT DOCUMENTS

| 5,293,557 | A | | 3/1994 | Fujinaga et al. |
| 5,838,594 | A | * | 11/1998 | Kojima ........................ 716/20 |
| 6,556,702 | B1 | * | 4/2003 | Rishton et al. ............. 382/144 |
| 7,369,973 | B2 | * | 5/2008 | Kennon et al. ................. 703/2 |

| 2002/0135577 | A1 | | 9/2002 | Kase et al. |
| 2004/0210429 | A1 | * | 10/2004 | Yu et al. ......................... 703/9 |
| 2005/0197817 | A1 | * | 9/2005 | Iwaki et al. ................... 703/14 |
| 2007/0188490 | A1 | * | 8/2007 | Kanai et al. ................. 345/423 |
| 2007/0239413 | A1 | * | 10/2007 | Yu ................................. 703/9 |

FOREIGN PATENT DOCUMENTS

JP 4-133326 A 5/1992

(Continued)

OTHER PUBLICATIONS

Robert L. Taylor, FEAP—Finite Element analysis program, Dec. 2000.*
T. Hara; "Fundamental of Finite Element Method in Fluids", Shokodo Co., Ltd., Jan. 1981, pp. 61-62, 71 and 77-78.

(Continued)

*Primary Examiner*—Paul L Rodriguez
*Assistant Examiner*—Andre Pierre Louis
(74) *Attorney, Agent, or Firm*—Westerman, Hattori, Daniels & Adrian, LLP

(57) ABSTRACT

The simulation apparatus includes mesh dividing section, process condition setting section, boundary surface simulating section for simulating a change in a shape of a boundary surface of the structure which change is caused from the process using the calculation condition set by the process condition setting section, level value determining section for determining level values each of which concerns a distance between one of the nodes and the boundary surface, and level value data retaining section for retaining, for each of the nodes, the level value in association with the boundary surface. The simulation apparatus makes it possible to express a number of materials being smaller in size than the mesh element. Consequently, the mesh element size can be set larger to improve the memory consumption amount and the calculation speed.

18 Claims, 6 Drawing Sheets

FOREIGN PATENT DOCUMENTS

| | | |
|---|---|---|
| JP | 2000-340476 A | 12/2000 |
| JP | 2002-230054 A | 8/2002 |
| JP | 2002-351857 A | 12/2002 |
| JP | 2003-150651 A | 5/2003 |

OTHER PUBLICATIONS

International Search Report of PCT/JP2005/004809, date of mailing May 10, 2005.

* cited by examiner

SIMULATION APPARATUS, SIMULATION METHOD, AND COMPUTER-READABLE RECORDING MEDIUM IN WHICH SIMULATION PROGRAM IS STORED

TECHNICAL FIELD

The present art relates to a technique of simulation on the shape formed by processes for a multilayer film exemplified by a semiconductor and an MR (Magneto-Resistive) head.

BACKGROUND

In the development and the fabrication of a part, e.g., a semiconductor and a MR (Magneto-Resistive) head used for a hard disk drive, formed by depositing layers made from different materials, prototype manufacture and evaluation are important for designing the parts. In recent years, such manufacture and evaluation have been generally substituted by simulation on a computer in order to save time and costs.

SUMMARY

According to an aspect of an embodiment an apparatus comprises:

a mesh dividing section dividing an analysis object region including the structure into a plurality of mesh elements, each of which formed by a number of nodes and a number of grid lines that connects the nodes;

a process condition setting section setting a calculation condition for a process to be performed on the structure;

a boundary surface simulating section simulating a change in a shape of a boundary surface of the structure which change is caused from the process using the calculation condition set by said process condition setting section;

a level value determining section determining level values each of which concerns a distance between one of the nodes and the boundary surface on the basis of the shape of the boundary surface whose change has been simulated by said boundary surface simulating section; and a level value data retaining section retaining, for each of the nodes, the plural level values, serving as level value data, determined by said level value determining section in association with the boundary surface.

DETAILED DESCRIPTION OF THE EMBODIMENT

Hereinafter, the first embodiment will now be described with reference to the accompanying drawings.

Figure 1:
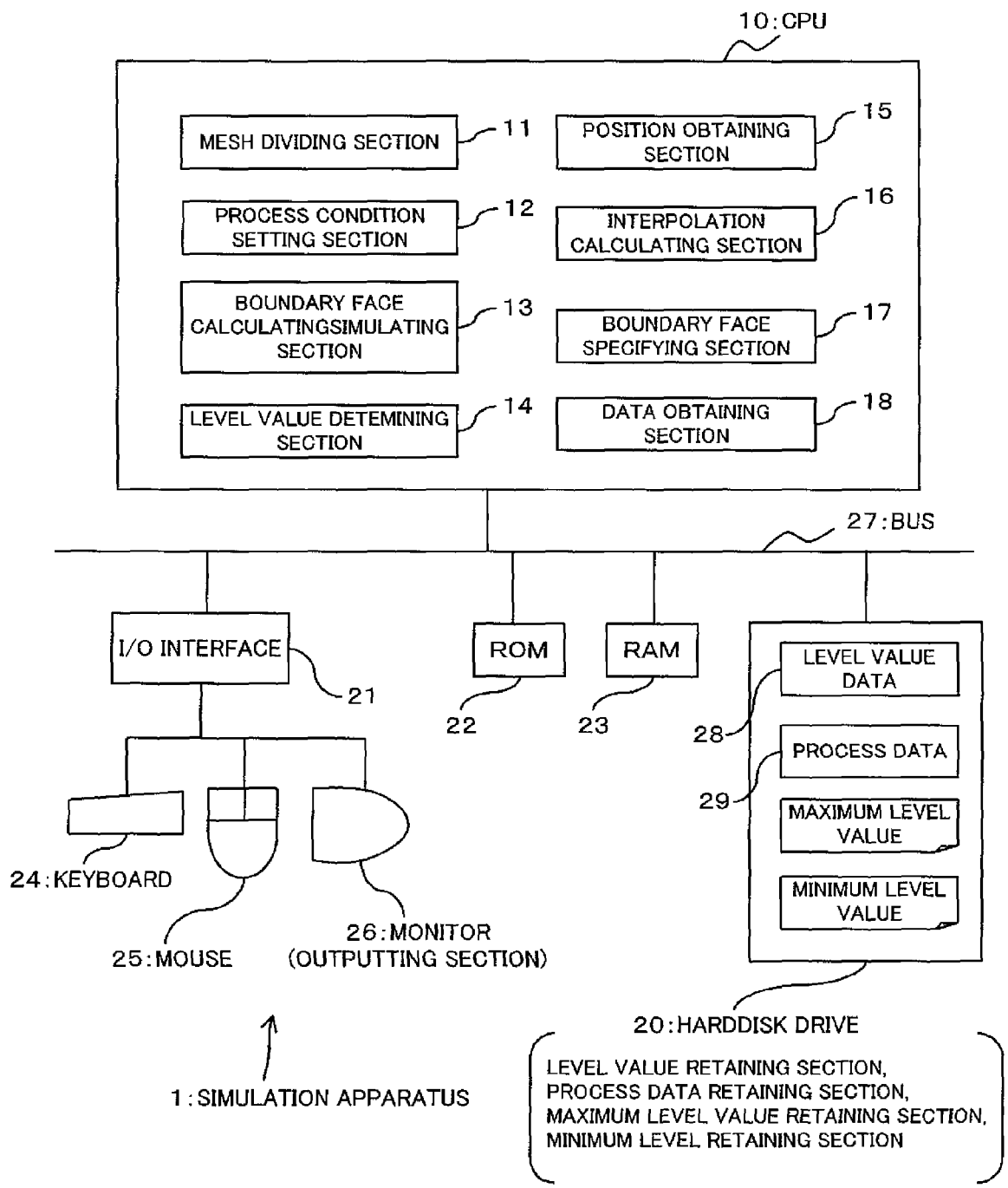
FIG. 1 is a diagram schematically showing the configuration of a simulation apparatus according to a first embodiment.
Figure 2:
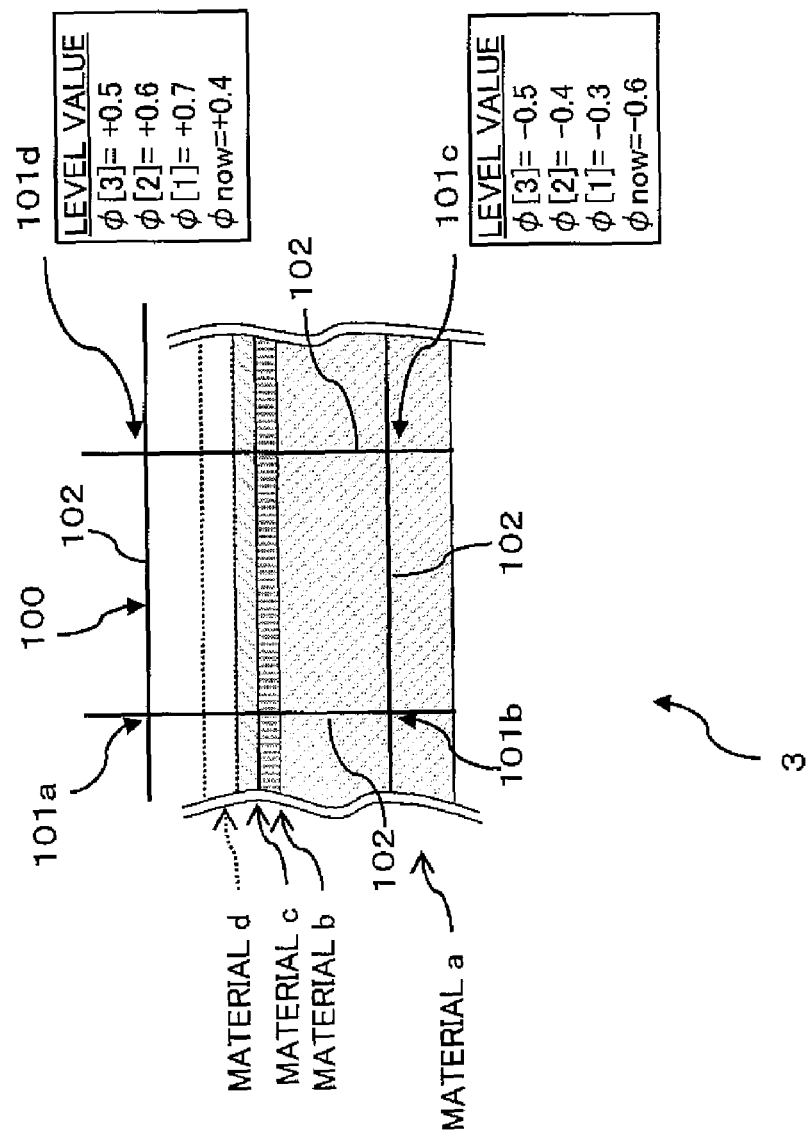
FIG. 2 is a fragmentary sectional diagram illustrating the configuration of a multilayer film the conformation of which is to be simulated by the simulation apparatus of the first embodiment.

FIG. 1 schematically shows the configuration of the simulation apparatus according to the first embodiment. FIG. 2 schematically shows a fragmentary section of a multilayer film the conformation of which is to be simulated by the simulation apparatus. FIG. 2 shows the side section of multilayer film 3 by partially cutting.

Simulation apparatus 1 simulates the conformation of a structure, e.g., a multilayer film such as a semiconductor or a MR (Magneto-Resistive) head, produced by forming (depositing) layers made from a number of materials and performing processes such as etching or cutting on the surface thereof.

Simulation apparatus 1 is served by a personal computer capable of realizing various functions by executing an OS (Operating System) and applications in CPU 10, and takes the form of a computer system equipped with CPU 10, HDD 20, I/O interface 21, ROM 22, RAM 23, monitor 26, keyboard 24, mouse 25, and bus 27, as shown in FIG. 1.

In the first embodiment, description will be made in relation to simulation on the conformation of multilayer film (structure) 3 of a MR head serving as the structure. Multilayer film 3 has a layered conformation formed by successively depositing four materials-material a, material b, material c and material d. The first embodiment assumes that material a, material b, material c, and material d that form multilayer film 3 are different.

The example shown in FIG. 2 illustrates a process in which material d is being deposited after depositing of material a, material b and material c, and represents material d with the dotted line.

The simulation apparatus 1 performs simulation on the conformation of multilayer film 3 so that a material (data concerning a process) at an arbitrary position of the multilayer film 3 can be grasped (material judgment can be realized).

Monitor (outputting section) 26 displays various data and, for example, takes the form of a CRT (Cathode Ray Tube) display or a LCD (Liquid Crystal Display) display. Monitor 26 displays data (to be described below) concerning a process which data is obtained by a data obtaining section that is to be described below and thereby functions as an outputting section for outputting the data concerning a process.

Monitor 26 is controlled by I/O interface 21 that is to be described below.

Keyboard 24 allows an operator to key-input various data pieces, and mouse 25 allows the operator to select and input various information pieces by moving and clicking pointer (not shown) displayed on monitor 26.

I/O interface 21 controls input via inputting device such as keyboard 24 and mouse 25, and controls output to outputting device of monitor 26.

In the first embodiment, simulation apparatus 1 includes, as inputting devices, keyboard 24 and mouse 25, to which the inputting device should by no means be limited. Alternatively, the inputting means may be a device (e.g., a flexible disk drive, a CD-ROM drive, or a DVD drive) that is able to read data from various media such as a flexible disk, a CD (e.g., CD-ROM, CD-R, or CD-RW), a DVD (e.g., DVD-ROM, DVD-RAM, DVD-R, DVD+R, DVD-RW, DVD+RW), a LAN (Local Area Network) and others. The I/O interface 21 may control such inputting means.

Similarly, simulation apparatus 1 of the first embodiment includes monitor 26 serving as an outputting section, but should by no means be limited to the monitor. As an alternative, the outputting section may be exemplified by a device (e.g., a flexible disk drive, a CD-ROM drive, or a DVD drive) able to output data to various media such as a flexible disk, a CD, a DVD and paper, a LAN, a printer unit and others. I/O interface 21 may control such outputting means, and the outputting means may output (file output) data in the form of a data file usable by another application and another information processor.

ROM (Read Only Memory) 22 retains various data and applications, and CPU 10 to be described below carries out various arithmetic operations using data retained in the ROM 22 and the like. RAM (Random Access Memory) 23 temporarily retains various data and applications, and used for temporarily retaining and expending data when CPU 10 to be described below is to perform arithmetic operations.

HDD 20 is a storage unit able to retain an OS, various data and application ready to be written and read. As described below, HDD 20 functions as a level value data retaining section which retains level value data 28 in which a level value determined by level value determining section 14 is associated with a boundary surface.

In addition, HDD 20 also function as a process data retaining section which retains process data 29 in which a boundary surface is associated with a process that forms the boundary surface, as detailed below.

Still further, HDD 20 also functions as a maximum level value retaining section which retains a level value (the maximum level value $\phi$ max) which represents the level value when a distance between a node and a boundary surface is maximum, and a minimum level value retaining section which retains a level value (the minimum level value $\phi$ min) which represents the level value when a distance between a node and a boundary surface is minimum.

Bus 27 communicably interconnects CPU 10, I/O interface 21, ROM 22, RAM 23, and HDD 20.

CPU 10 realizes various functions by executing an OS and applications stored in HDD 20, ROM 22, and RAM 23. In the first embodiment, CPU 10 executing a simulation program functions as mesh dividing section 11, process condition setting section 12, boundary surface simulating section 13, level value determining section 14, position obtaining section 15, interpolation calculating section 16, boundary surface specifying section 17, and data obtaining section 18.

A program (simulation program) to realize the functions for mesh dividing section 11, process condition setting section 12, boundary surface simulating section 13, level value determining section 14, position obtaining section 15, interpolation calculating section 16, boundary surface specifying section 17, and data obtaining section 18 is provided in the form of being recorded in a computer-readable recording medium exemplified by a flexible disk, a CD, a DVD, a magnetic disk, an optical disk, or magneto-optical disk. In this case, the computer reads the program from the recoding medium and sends the read program to store in to an internal or external memory for future use. Alternatively, the program may be previously recorded in a storage unit (a recording medium) exemplified by a magnetic disk, an optical disk or a magnet-optical disk, and provided to a computer from the storage unit through communication path.

In order to realize the function for mesh dividing section 11, process condition setting section 12, boundary surface simulating section 13, level value determining section 14, position obtaining section 15, interpolation calculating section 16, boundary surface specifying section 17, and data obtaining section 18, a microprocessor (in the illustrated example, CPU 10) executes the simulation program stored in an internal storage unit (in the illustrated example, ROM 22 or RAM 23). Alternatively, the computer may read a simulation program from a recording medium and executes the read program.

The concept of a computer in this embodiment includes hardware and an OS (Operating System) and means hardware that operates under control of the OS. If an application program independently operates hardware, requiring no OS, the hardware itself corresponds to a computer. Hardware includes at least a microprocessor such as a CPU and means for reading a computer program recorded in a recording medium. In the first embodiment, simulation apparatus 1 has a function as such a computer.

Further, the recording medium used in this embodiment may be one from various computer-readable recording medium incorporates in the form of an IC card, a ROM cartridge, a magnetic tape, a punch card, an internal memory (such as a RAM or a ROM) in a computer, an external memory, or a printed matter on which codes such as bar codes are printed, other than the above examples of a flexible disk, a CD, a DVD, a magnetic disk, an optical disk and a magneto-optical disk.

Figure 3:
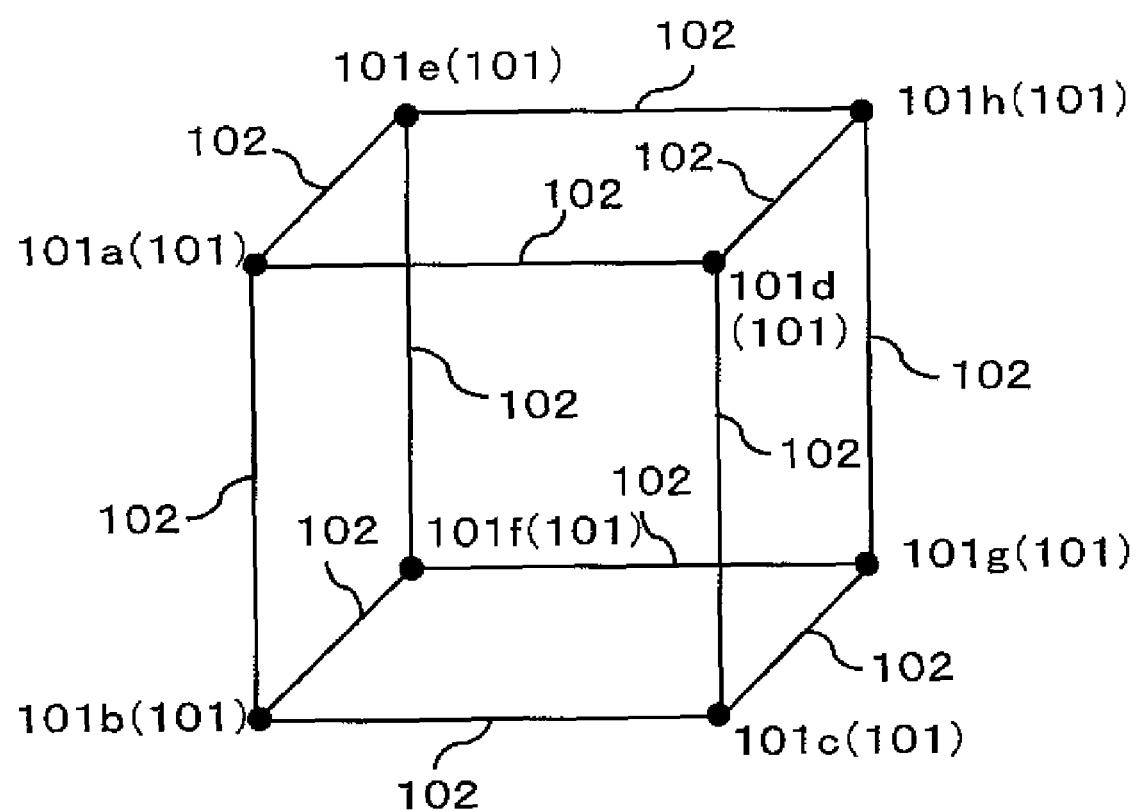
FIG. 3 is a diagram showing an exemplary cell formed by a mesh dividing section in the simulation apparatus of the first embodiment.

FIG. 3 is a diagram illustrating an example of a cell (a mesh element) 100 formed by mesh dividing section 11 of the simulation apparatus 10 according to the first embodiment.

Cell 100 is, as shown in FIG. 3, an element of a hexahedron formed by a number of nodes 101 (101a, 101b, 101c, 101d, 101e, 101f, 101g, 101h) and grid lines connecting these nodes 101. Mesh dividing section 11 divides an analysis object region including multilayer film 3 into two or more cells 100.

In the first embodiment, mesh dividing section 11 mesh-divides an analysis object region into cells 100 in the form of hexahedron elements whereby an arbitrary point of an analysis object region is included in one of a number of cells 100 which are created by mesh division and which are successively arranged in the vertical and horizontal directions.

In the present embodiment, eight nodes that form cell 100 are represented by reference numbers 101a, 101b, 101c, 101d, 101e, 101f, 101g, and 101h. Hereinafter, reference numbers 101a, 101b, 101c, 101d, 101e, 101f, 101g, and 101h are used if one particular nodes need to be discriminated from the others, but an arbitrary node is represented by reference number 101.

The manner of mesh division on an analysis object region is realized by any of various known methods, description of which is omitted here.

Process condition setting section 12 sets a simulation calculation condition (a calculation condition) for a process to be performed on multilayer film 3, and, for example, sets a simulation calculation condition for a process such as depositing (film depositing), etching and cutting that is to be performed on the surface of multilayer film 3 being fabricated.

Specifically, process condition setting section 12 sets, as calculation conditions, parameters for calculation accuracy such as the number of time steps and the number of meshes besides amounts of cutting, layer formation, and depositing and substance constant.

Boundary surface simulating section 13 simulates a change in the shape of a boundary surface subjected to a process using a calculation condition set by process condition setting section 12 to obtain the shape of the surface (the boundary surface) after being subjected to a process on the basis of a calculation condition set by process condition setting section 12.

In the first embodiment, a boundary surface represents each individual surface of materials a, b, c, and d, which form multilayer film 3, as shown in FIG. 2, and includes faces shaped by a process, such as etching or cutting, performed on the materials a, b, c, and d besides faces formed by depositing materials a, b, c, and d.

Level value determining section 14 determines, on the basis of the face shape calculated by boundary surface simulating section 13, a level value φ for each node 101 which value concerns a distance between the node and a boundary surface. A level value φ represents a distance between node 101 and the boundary surface of each of materials a, b, c, and d which form multilayer film 3, and the absolute value of the level value φ is a distance from the boundary surface.

Level values φ represent shapes of a number of materials and a level value φ is created for a calculation concerning each process or each material. During the fabrication of multilayer film 3, one or more level values φ are added accordingly to a boundary surface that has been subjected to a process each time a process has been completed.

A level value φ for node 101 (e.g., nodes 101*b* and 101*c* in FIG. 2) inside the structure (multilayer film 3) is marked with a − (read as minus) sign; and a level value for node 101 (e.g., nodes 101*a* and 101*d* in FIG. 2) outside the structure (multilayer film 3) is marked with a + (read as plus) sign.

In the present embodiment, a level value φ[n] represents a level value with respect to a boundary surface of a material forming n-th layer (where, n is a natural number) of multilayer film 3.

In the example shown in FIG. 2, the conformation of multilayer film 3 is expressed by setting, concerning node 101*c*, level value φ[1]=−0.3 with respect to the surface of material a (the boundary surface between material a and material b), level value φ[2]=−0.4 with respect to the surface of material b (the boundary surface between material b and material c), and level value φ[3]=−0.5 with respect to the surface of material c (the boundary surface between material c and material d).

In the same manner, the conformation of multilayer film 3 is expressed by setting, concerning node 101*d*, level value φ[1]=+0.7 with respect to the surface of material a (the boundary surface between material a and material b), level value φ[2]=+0.6 with respect to the surface of material b (the boundary surface between material b and material c), and level value φ[3]=+0.5 with respect to the surface of material c (the boundary surface of material c and material d).

The example shown in FIG. 2 is in the process of forming material d as described above, and therefore illustrates a state in which the surface (a portion the shape of which is changing) is focused. Node 101*c* has level value φnow=−0.6 with respect to the shape changing portion, and node 101*d* has level value φnow=0.4 with respect to the shape changing portion.

The level values φ with respect to the boundary surfaces of materials a, b, c, and d are stored, for each node, in HDD 20 as level value data 28 in which the level values are associated with the boundary surfaces. Specifically, a level value φ is stored as level value data 28 in HDD 20, being associated with the number NL (NL is a natural number) for specifying a layer (material) whose surface is serving as a boundary surface and with a code or the like for specifying a node 101.

In HDD 20, process data 29 in which information of a boundary surface is associated with information of a process performed to form the boundary surface is stored. Specifically, process data 29 of the present embodiment associates the number NL to specify a boundary surface with information (material information, data concerning a process) concerning a material which is specified by the number NL.

Information to specify nodes 101 can be codes and the like each of which is predetermined for one of the nodes 101. As the material information, codes previously allocated one to each material or material names can be used, for example.

Position obtaining section 15 obtains a verification position used to verify the conformation of multilayer film 3 by receiving an input from an operator via keyboard 24 or 25, or by obtaining a coordinate (a verification position) of a material judgment position notified from another application via I/O interface 21.

Further, position obtaining section 15 specifies, on the basis of the obtained coordinate of a material judgment position, cell 100 including the coordinate of the material judgment position from a number of cells 100 vertically and horizontally succeeded over an analysis object region.

Interpolation calculating section 16 carries out an interpolation calculation using interpolation formula (1) shown below for a level value using the verification position coordinate (SX, SY, SZ) obtained by position obtaining section 15.

$$\phi(X,Y,Z)=\phi(-,-,-)*(1-SX)*(1-SY)*(1-SZ)/8+ \\ \phi(-,-,+)*(1-SX)*(1-SY)*(1+SZ)/8+\phi(-,+,-)*(1-SX)*(1+SY)*(1-SZ)/8+\phi(-,+,+)*(1-SX)*(1+SY)*(1+SZ)/8+\phi(+,-,-)*(1+SX)*(1-SY)*(1-SZ)/8+\phi(+,-,+)*(1+SX)*(1-SY)*(1+SZ)/8+\phi(+,+,-)*(1+SX)*(1+SY)*(1-SZ)/8+\phi(+,+,+)*(1+SX)*(1+SY)*(1+SZ)/8 \quad (1)$$

In the above interpolation formula (1), φ(+,−,+), φ(+,−,−), φ(+,+,−), φ(+,+,+), φ(−,−,+), φ(−,−,−), φ(−,+,−), and φ(−,+,+) represent level values set for nodes 101*a*, 101*b*, 101*c*, 101*d*, 101*e*, 101*f*, 101*g*, and 101*h*, respectively, that form cell 100 shown in FIG. 3.

Figure 4:
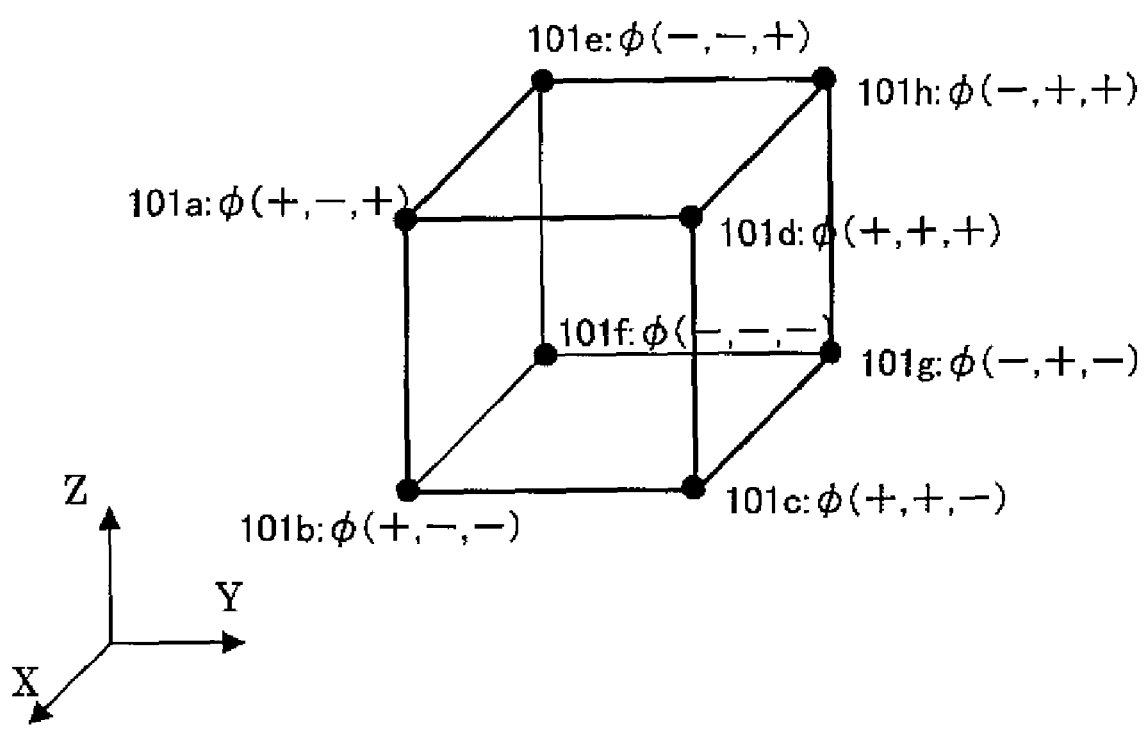
FIG. 4 is a diagram explaining an interpolation formula used by an interpolation calculating section of the simulation apparatus of the first embodiment.

FIG. 4 explains interpolation formula (1) used by interpolation calculating section 16 of the simulation apparatus 10 according to the first embodiment. In FIG. 4, level values set for nodes 101*a*, 101*b*, 101*c*, 101*d*, 101*e*, 101*f*, 101*g*, and 101*h* that form cell 100 shown in FIG. 3 is represented by φ(+,−,+), φ(+,−,−), φ(+,+,−), φ(+,+,+), φ(−,−,+), φ(−,−,−), φ(−,+,−) and φ(−,+,+), respectively.

For example, φ(+,+,+) represents level values φ[1], φ[2], φ[3], φ now set for node 101*d* in FIG. 2. The length (the cell size) of each side of cell 100 shown in FIG. 4 assumes to be 2.

Interpolation calculating section 16 obtains level values φ set for each node 101 that forms cell 100 specified by the position obtaining section 15 and performs an arithmetic operation of the above-described interpolation formula using the level values whereby the interpolation calculation for each level value is carried out.

Figure 6:
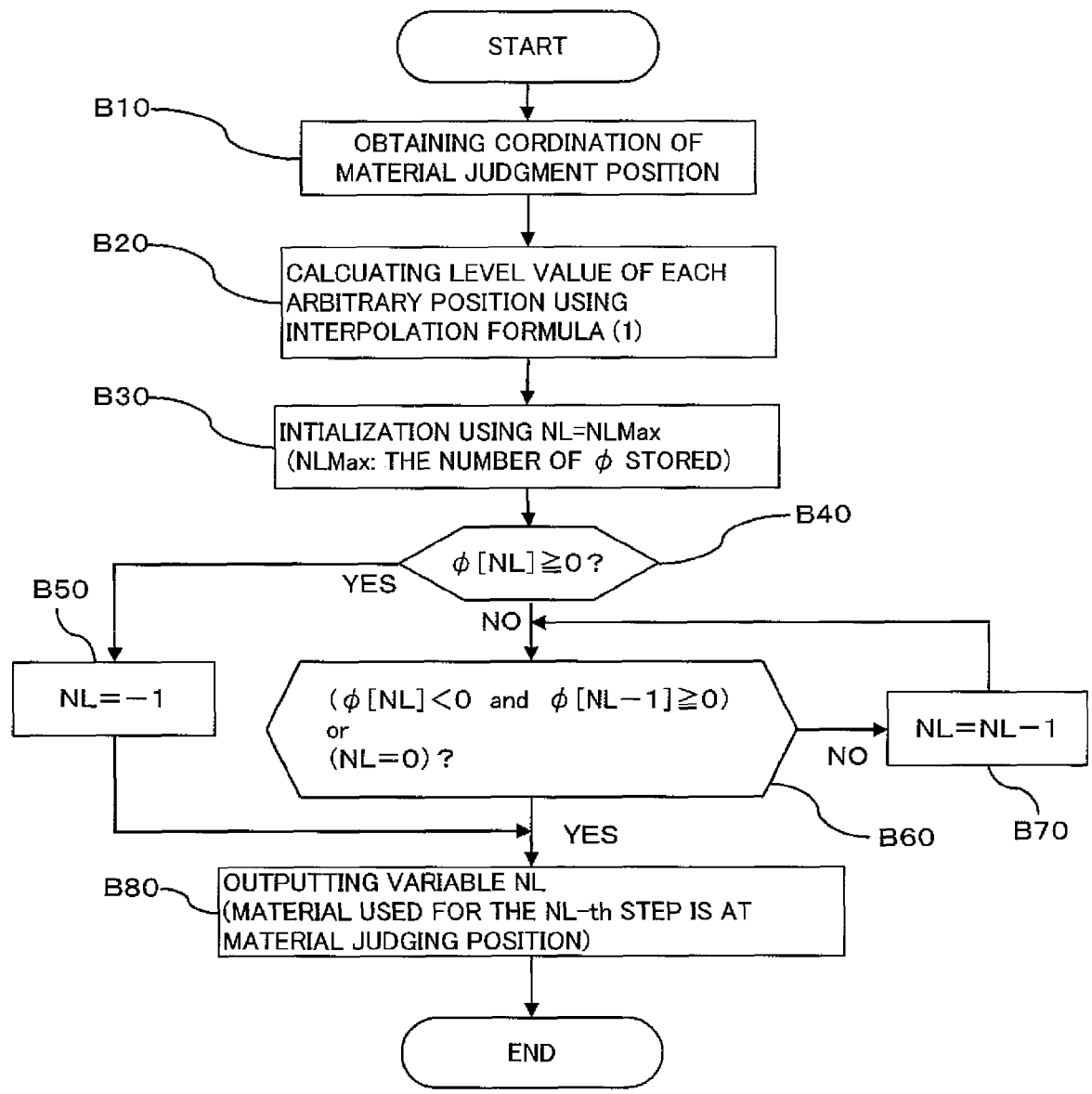
FIG. 6 is a flow diagram explaining a manner to judge a material at an arbitrary position in a multilayer film in the first embodiment.

Boundary surface specifying section 17 specifies, with reference to the level value data 28 stored in HDD 20 on the basis of a level value φ calculated by interpolation calculating section 16, a material corresponding to a level value that satisfies a material selecting condition previously determined. A flow chart to judge satisfaction of a material selecting condition is shown in FIG. 6.

The material selecting conditions are: (1) level value φ[NL] being smaller than 0 (zero) and the level value φ[NL−1] being equal to or larger than 0 and (2) NL being 0. NL being −1 represents the absence of a material on the position in question.

Data obtaining section 18 obtains, with reference to process data 29 stored in HDD 20 on the basis of a boundary surface specified by boundary surface specifying section 17, data (in the illustrated example, material data) concerning the process corresponding to the specified boundary surface.

The material data obtained by data obtaining section 18 is output to monitor 26 to be the material data for a material judgment position and is consequently notified to an operator.

In the simulation apparatus 10 having the configuration described above, mesh dividing section 11 first of all divides an analysis object region including multilayer film 3 into a number of cells 100 (the mesh dividing step), so that simulation for the fabrication of multilayer film 3 is to be performed on the analysis object region which has been divided into the meshes.

In order to initiate the simulation, level values are determined for each node 101 in cell 100 in the analysis object region with respect to the first boundary surfaces of the layers that form multilayer film 3.

Figure 5:
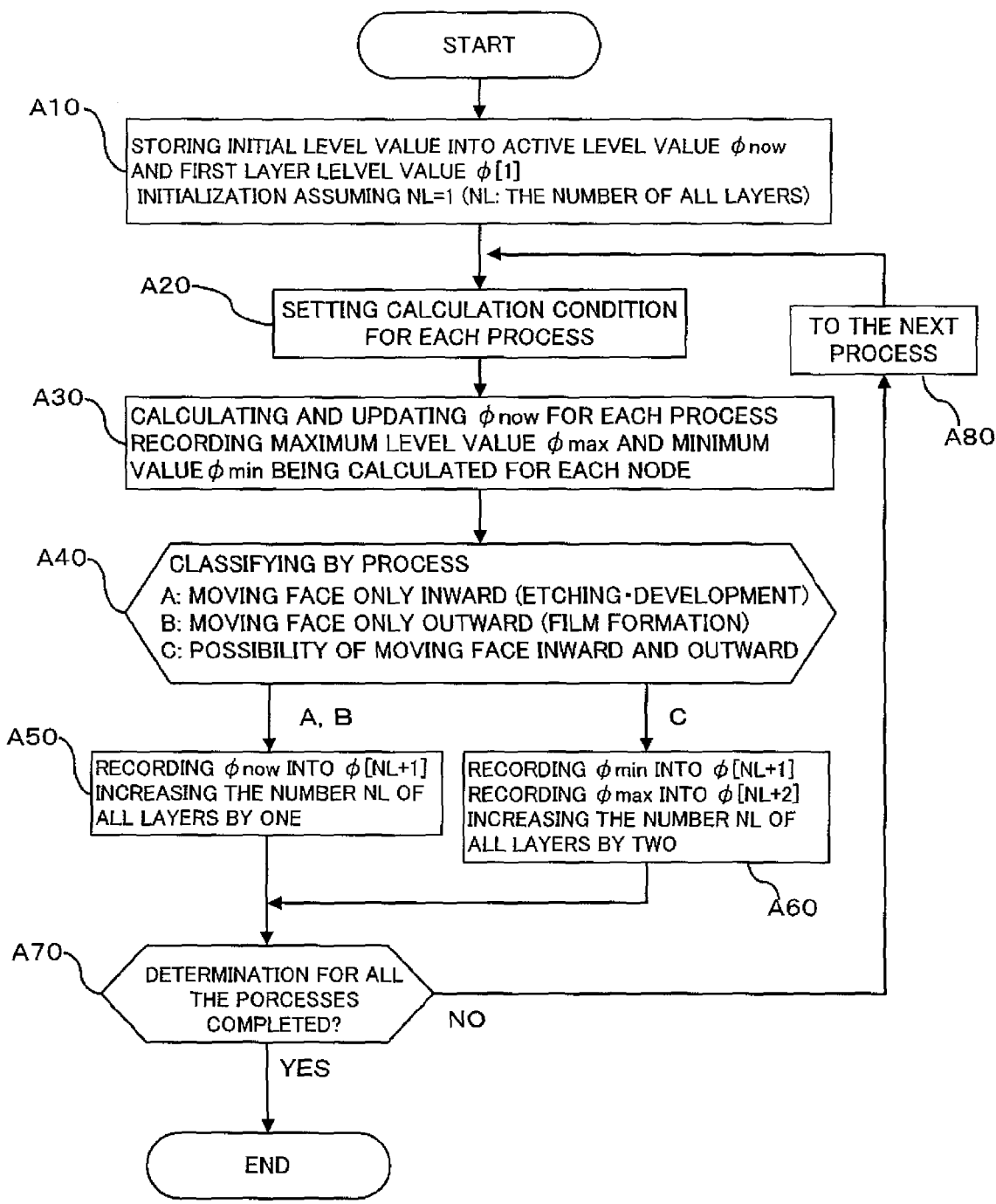
FIG. 5 is a flow diagram explaining a manner to determine level values by the simulation apparatus of the first embodiment.

Here, description will be made in relation to a manner to determine a level value in the simulation apparatus 10 according to the first embodiment with reference to flow diagram FIG. 5 (steps A10-A80). Hereinafter, a natural number is set as the variable NL.

First of all, level value determining section 14 determines the initial level value, i.e., the level value of the surface of material a, into the level value ϕnow and the level value ϕ[1], and sets the variable NL to be (NL=1) whereby the initialization is completed (step A10, the level value setting step). At the same time, a selection is made for a process that is to be carried out as the first step performed on the surface in the fabrication of multilayer film 3.

Next, process condition setting section 12 sets a calculation condition for the process that is to be performed on the surface in the production of multilayer film 3 (step A20, the process condition setting step) Boundary surface simulating section 13 calculates the level values ϕ now, ϕ max and ϕ min corresponding to the surface shape (the boundary surface shape) being subjected to each process on the basis of the calculation condition set by process condition setting section 12 (step A30, the boundary surface calculation step, the level value determining step, the minimum level value determining step).

In addition, the boundary surface and material data of the layer forming the boundary surface are associated with each other to be process data 29, which is to be stored in HDD 20 (the process data storing step).

In succession, on the basis of the calculation condition set in step A20, level value determining section 14 judges whether the process is corresponding to "A: a process moving the boundary surface only inward (e.g., etching or development)", "B: a process moving the boundary surface only outward (e.g., film formation)", or "C: a process having a possibility of moving face inward and outward" (step A40).

As the result of the judgment, if the process corresponds to "A: a process moving the boundary surface only inward" or "B: a process moving the boundary surface only outward (e.g., film formation)" (routes A and B of step A40), the value ϕ now is stored into ϕ[NL+1] in level value data 28 stored in HDD 20 (the level value storing step) and NL is increased by one (NL=NL+1) (step A50)

If the process corresponds to "C: a process having possibility of moving face inward and outward" (route C of step A40), the level value minis stored into ϕ[NL+1] in level value data 28 stored in HDD 20 and the level value ϕ max is stored into ϕ[NL+2] in the level value data 28 (the level value storing step) and further NL is increased by two (NL=NL+2) (step A60).

The procedure according to steps A20-A60 is performed on each node 101 in the analysis object region.

Level value determining section 14 judges whether or not the procedure has been carried out on all the processes that are to be executed in the fabrication of multilayer film 3 (step A70), and if the procedure has not been performed on all the processes (NO route of step A70), the procedure move to concern the next process (step A80) to perform step A20.

Conversely, if the procedure has been performed on all the processes (YES route of step A70), the succession of the procedural step is completed.

Next, description will be made in relation to a manner of material judgment for an arbitrary position in multilayer film 3 which judgment is made by simulation apparatus 10 with reference to flow diagram FIG. 6 (steps B10-B80).

Upon operator's input of a material judgment position via keyboard 24 or mouse 25, for example, position obtaining section 15 obtains the coordinate of the material judgment position (step B10, the position obtaining step) to specify cell 100 which includes the coordinate of the material judgment position. If another program such as a drawing program displays the shape, the program designates the material judgment position.

Next, interpolation calculating section 16 calculates, on the basis of the coordinate (SX, SY, SZ) of the material judgment position obtained by position obtaining section 15 and the level value ϕ set for each node 101 of the cell 100 selected in step B10, a level value ϕ of the material judgment position (by the interpolation calculation) using the interpolation formula (1) described above (step B20, the interpolation calculating step).

Further, interpolation calculating section 16 obtains, with reference to level value data 28 stored in HDD 20, the total number NLMax of level values stored and sets the number NLMax into the variable NL to initialize the variable NL (step B30).

In the first embodiment, since verification is conducted on layers sequentially from outer surfaces (i.e in order of later formation), there is no problem in verification even if a layer that has once formed is cut (deleted) in the fabrication process.

Interpolation calculating section 16 obtains, with reference to level value data 28 on the basis of the value of NL, the level value ϕ[NL] and judges whether or not the level value ϕ[NL] is equal to or larger than zero (step B40). If the level value ϕ[NL] is equal to or larger than zero, interpolation calculating section 16 responsively returns NL=−1 that indicates no material.

If the level value ϕ[NL] is smaller than zero (NO route in step B40), interpolation calculating section 16 then judges whether the level value ϕ[NL] is smaller than zero and the level value ϕ[NL−1] is equal to or larger than zero, or whether or not NL is zero (step B60; the boundary surface specifying step).

The level value ϕ[NL] being smaller than zero, that is the level value ϕ[NL] being negative, indicates the presence (embedding) of a material at the verification position; but the level value ϕ[NL−1] being equal to or larger than zero indicates the absence (not embedded) of a material on the verification position.

Here, if the level value ϕ[NL] is smaller than zero and the level value ϕ[NL−1] is equal to or larger than zero or if NL is equal to zero (YES route in step B60), the variable NL is obtained (output) and data obtaining section 18 obtains, with reference to level value data 28 stored in HDD 20, a material used in the NL-th step in the fabrication of multilayer film 3 to be a material present at the material judgment position (the information obtaining step) to complete the procedure (step B80). Then the obtained material information is output to and displayed on monitor 26 for notification to the operator (the outputting step).

If the condition that the level value ϕ[NL] is smaller than zero and the level value ϕ[NL−1] is equal to or larger than zero is not satisfied, or if NL is not equal to zero (NO route in step B60), the value NL is decreased by one (NL=NL−1) (step B70) and the procedure returns to step B60.

On the other hand, if the φ[NL] is larger than zero (YES route in step B40), −1 is assigned to the value NL (step B50) and the procedure shifts to step B80.

As described above, the simulation apparatus 10 according to the first embodiment determines level values φ for each node 101 which values concern the distances between the node and boundary surfaces of multilayer film 3, the conformation of multilayer film 3 can be expressed by these level values φ, with which the conformation of multilayer film 3 can be expressed irrespective of the cell size. That makes it possible to express the shapes of number of materials that are smaller in size than the cell size and additionally to allow the cell size to be large, resulting in improvement of memory consumption amount and calculation speed.

The present embodiment should by no means be limited to the foregoing embodiment and various changes and modification can be suggested without departing from the concept of the present embodiment.

For example, in the described first embodiment, mesh dividing section 11 mesh-divides an analysis object region into cubic cells 100, but the shape of cell 100 should by no means be limited to a cube. Alternatively, cell 100 created by mesh-division may take any shape exemplified by a tetrahedron element, orthogonal grid, or an octree mesh.

If the present embodiment utilizes a cell in the shape other than a hexahedron, interpolation calculating section 16, needless to say, uses another interpolation formula suitable for the shape of a cell, as a substitute for interpolation formula (1), in order to carry out an interpolation calculation for a level value of a verification position. Such a substitute interpolation formula can be obtained with reference to fundamental of finite element method in fluids (written by Takehisa Hara, published by Shokodo Co., Ltd.) and others.

The above first embodiment simulate the shape of multilayer film 3, to which should by no means be limited. As an alternative, the simulation may be performed on a shape of a semiconductor part such as an LSI.

In other words, the present embodiment can be applied to simulation on a structure formed by depositing a number of materials and on a structure formed by a number of processes subsequently performed on the surface thereof.

The above first embodiment simulates on the shape of a structure formed by sequentially depositing materials a, b, c and d dimensions of which do not reduce during the fabrication. The structure should by no means be limited to such a structure. Alternatively, the structure may be fabricated by a process, such as etching or cutting, which reduces the dimension of a material.

Further, in the first embodiment, level value data 28 and process data 29 are separately prepared, but the preparation should by no means be limited to this. Alternatively, level value data 28 and process data 29 may be provided in the form of a single common database.

The disclosure of an embodiment of the present embodiment allows those skilled in the art to carry out and produce the present embodiment.

What is claimed is:

1. A simulation apparatus for simulating the conformation of a structure in the form of a multilayer film, comprising:
    a mesh dividing section dividing an analysis object region including the structure into a plurality of hexahedron mesh elements, each of which formed by a number of nodes and a number of grid lines that connects the nodes;
    a process condition setting section setting a calculation condition for a process to be performed on the structure;
    a boundary surface simulating section simulating a change in a shape of a boundary surface of the structure which change is caused from the process using the calculation condition set by said process condition setting section;
    a level value determining section determining level values each of which represents an absolute value of a distance between one of the nodes and the boundary surface on the basis of the shape of the boundary surface whose change has been simulated by said boundary surface simulating section; and
    a level value data retaining section retaining, for each of the nodes, the plural level values, serving as level value data, determined by said level value determining section in association with the boundary surface,
    the multilayer film having a plurality of the boundary surfaces,
    said level value determining section determining a plurality of level values representing the absolute values of distances between each said node and the plurality of boundary surfaces, one defined by each of a plurality of layers of the multilayer film wherein said level value determining section further judges whether the process corresponds to a process moving the boundary surface only inward or only outward or both inward and outward, wherein if the process corresponds to a process moving inward or outward, a natural number (NL) is increased by one such that NL=NL+1 and if the process corresponds to a process moving both inward and outward, NL is increased by two such that NL=NL+2;
    each of the grid lines of said plurality of hexahedron mesh elements being larger than the thickness of each of layers of the multilayer film,
    said mesh dividing section, said process condition setting section, said boundary surface simulating section, and said level value determining section being realized by a processor.

2. A simulation method for simulating the conformation of a structure in the form of a multilayer film, comprising the steps of:
    dividing an analysis object region including the structure into a plurality of hexahedron mesh elements, each of which is formed by a number of nodes and a number of grid lines that connect the nodes;
    setting a calculation condition for a process to be performed on the structure;
    simulating a change in a shape of a boundary surface of the structure which change is caused from the process using the calculation condition set in said step of setting;
    determining level values each of which represents an absolute value of a distance between one of the nodes and the boundary surface on the basis of the shape of the boundary surface whose change has been calculated in said step of simulating; and
    retaining, for each of the nodes, the level values, serving as level value data, determined in said step of determining in association with the boundary surface,
    the multilayer film having a plurality of the boundary surfaces,
    said level value determining section determining a plurality of level values representing the absolute values of distances between each said node and the plurality of boundary surfaces, one defined by each of a plurality of layers of the multilayer film wherein said level value determining section further judges whether the process corresponds to a process moving the boundary surface only inward or only outward or both inward and outward, wherein if the process corresponds to a process moving inward or outward, a natural number (NL) is increased by one such that NL=NL+1 and if the process corresponds to a process moving both inward and outward, NL is increased by two such that NL=NL+2;

each of the grid lines of said plurality of hexahedron mesh elements being larger than the thickness of each of layers of the multilayer film, said mesh dividing section, said process condition setting section, said boundary surface simulating section, and said level value determining section being realized by a processor.

3. A computer-recording medium in which a simulation program for simulating the conformation of a structure in the form of a multilayer film is stored, said program, when executed by a processor, instructing a computer to execute the steps of:

dividing an analysis object region including the structure into a plurality of hexahedron mesh elements, each of which is formed by a number of nodes and a number of grid lines that connect the nodes;

setting a calculation condition for a process to be performed on the structure;

simulating a change in a shape of a boundary surface of the structure which change is caused from the process using the calculation condition set in said step of setting;

determining level values each of which represents an absolute value of a distance between one of the nodes and the boundary surface on the basis of the shape of the boundary surface whose change has been simulated in said step of simulating; and retaining, for each of the nodes, the level values, serving as level value data, determined in said step of determining in association with the boundary surface, the multilayer film having a plurality of the boundary surfaces, said level value determining section determining a plurality of level values representing the absolute values of distances between each said node and the plurality of boundary surfaces, one defined by each of a plurality of layers of the multilayer film judging whether the process corresponds to a process moving the boundary surface only inward or only outward or both inward and outward, wherein if the process corresponds to a process moving inward or outward, a natural number (NL) is increased by one such that NL=NL+1 and if the process corresponds to a process moving both inward and outward, NL is increased by two such that NL=NL+2;

each of the grid lines of said plurality of hexahedron mesh elements being larger than the thickness of each of layers of the multilayer film, said mesh dividing section, said process condition setting section, said boundary surface simulating section, and said level value determining section being realized by a processor.

4. The computer-recording medium in which simulation program according to claim 3, instructing the computer to further execute the steps of:

retaining process data which associates the boundary surface with data concerning the process to form the boundary surface;

determining a verification position that is to be used for verifying the conformation of the structure;

performing an interpolation calculation on the level values on the basis of the verification position determined in said step of determining;

specifying one boundary surface from at least two of the boundary surfaces, the one boundary surface being in association with the level values satisfying a boundary surface selecting condition predetermined with reference to the level value data retained in said step of retaining the level values as the level value data on the basis of the level values on which the interpolation has been performed in said step of performing the interpolation;

obtaining, on the basis of the one boundary surface specified in said step of specifying, the data concerning the process associated with the one boundary surface specified in said step of specifying with reference to the process data retained in said step of retaining process data; and outputting the data concerning the process obtained in said step of obtaining the data as data concerning the process to be performed on the verification position.

5. The computer-recording medium in which simulation program according to claim 3, instructing the computer to further execute the step of retaining one of the maximum level values.

6. The computer-recording medium in which simulation program according to claim 4, instructing the computer to further execute the step of retaining one of the maximum level values.

7. The computer-recording medium in which simulation program according to claim 3, instructing the computer to further execute the step of retaining one of the minimum level values.

8. The computer-recording medium in which simulation program according to claim 4, instructing the computer to further execute the step of retaining one of the minimum level values.

9. The computer-recording medium in which simulation program according to claim 5, instructing the computer to further execute the step of retaining one of the minimum level values.

10. The computer-recording medium in which simulation program according to claim 6, instructing the computer to further execute the step of retaining one of the minimum level values.

11. The computer-recording medium in which simulation program according to claim 3, instructing the computer to carry out said step of retaining the level values as the level value data such that each of the nodes is associated with the level values concerning two or more of the processes.

12. The computer-recording medium in which simulation program according to claim 4, instructing the computer to carry out said step of retaining the level values as the level value data such that each of the nodes is associated with the level values concerning two or more of the processes.

13. The computer-recording medium in which simulation program according to claim 5, instructing the computer to carry out said step of retaining the level values as the level value data such that each of the nodes is associated with the level values concerning two or more of the processes.

14. The computer-recording medium in which simulation program according to claim 6, instructing the computer to carry out said step of retaining the level values as the level value data such that each of the nodes is associated with the level values concerning two or more of the processes.

15. The computer-recording medium in which simulation program according to claim 7, instructing the computer to carry out said step of retaining the level values as the level value data such that each of the nodes is associated with the level values concerning two or more of the processes.

16. The computer-recording medium in which simulation program according to claim 8, instructing the computer to carry out said step of retaining the level values as the level value data such that each of the nodes is associated with the level values concerning two or more of the processes.

17. The computer-recording medium in which simulation program according to claim 9, instructing the computer to carry out said step of retaining the level values as the level value data such that each of the nodes is associated with the level values concerning two or more of the processes.

18. The computer-recording medium in which simulation program according to claim 10, instructing the computer to carry out said step of retaining the level values as the level value data such that each of the nodes is associated with the level values concerning two or more of the processes.

* * * * *